(12) United States Patent
Yoshikawa et al.

(10) Patent No.: US 7,196,877 B2
(45) Date of Patent: Mar. 27, 2007

(54) MAGNETORESISTIVE ELEMENT, MAGNETORESISTIVE HEAD AND MAGNETIC REPRODUCING APPARATUS

(75) Inventors: Masatoshi Yoshikawa, Yokohama (JP); Masayuki Takagishi, Kawasaki (JP); Tomomi Funayama, Fujisawa (JP); Kohichi Tateyama, Yokohama (JP); Hitoshi Iwasaki, Yokosuka (JP); Hideaki Fukuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 537 days.

(21) Appl. No.: 10/743,130

(22) Filed: Dec. 23, 2003

(65) Prior Publication Data

US 2004/0190204 A1 Sep. 30, 2004

(30) Foreign Application Priority Data

Dec. 26, 2002 (JP) .............................. 2002-378648

(51) Int. Cl.
*G11B 5/33* (2006.01)

(52) U.S. Cl. .................................................. 360/324.1

(58) Field of Classification Search ............. 360/324.2, 360/314, 324, 325, 126, 324.1, 324.12; 29/603.08; 365/173; 438/3
See application file for complete search history.

(56) References Cited

U.S. PATENT DOCUMENTS

| | | | | |
|---|---|---|---|---|
| 5,636,093 A * | 6/1997 | Gijs et al. ................... 360/126 |
| 5,715,121 A * | 2/1998 | Sakakima et al. ........ 360/324.2 |
| 6,178,074 B1 * | 1/2001 | Gill .......................... 360/324.2 |
| 6,347,049 B1 * | 2/2002 | Childress et al. ........... 365/173 |
| 6,348,274 B1 | 2/2002 | Kamiguchi et al. |
| 6,462,641 B1 * | 10/2002 | Dieny et al. .............. 338/32 R |
| 6,597,548 B1 * | 7/2003 | Yamanaka et al. ....... 360/324.2 |
| 6,606,781 B1 * | 8/2003 | Gill .......................... 29/603.08 |
| 6,839,206 B2 * | 1/2005 | Saito et al. ............... 360/324.2 |
| 2002/0164828 A1 * | 11/2002 | Ishiwata et al. ................ 438/3 |
| 2003/0026048 A1 * | 2/2003 | Yamanaka et al. ....... 360/324.2 |
| 2003/0026049 A1 * | 2/2003 | Gill ........................ 360/324.12 |
| 2003/0137783 A1 * | 7/2003 | Kokado ................... 360/324.2 |
| 2004/0190204 A1 | 9/2004 | Yoshikawa et al. |

FOREIGN PATENT DOCUMENTS

JP 2002-208744 7/2002
JP 2002-319112 10/2002

* cited by examiner

*Primary Examiner*—Tianjie Chen
(74) *Attorney, Agent, or Firm*—Oblon, Spivak, McClelland, Maier & Neustadt, P.C.

(57) ABSTRACT

A magnetoresistive element includes a magnetoresistive film having a magnetization pinned layer, a magnetization free layer, and a nonmagnetic intermediate layer. A magnetization direction of the magnetization pinned layer is substantially fixed in an external magnetic field, a magnetization direction of the magnetization free layer is configured to change in the external magnetic field, and the nonmagnetic intermediate layer formed between the magnetization pinned layer and the magnetization free layer and has a stacked structure of a first non-metallic intermediate layer/a metal intermediate layer/a second non-metallic intermediate layer. The magnetoresistive element also includes a pair of electrodes coupled to the magnetoresistive film and is configured to provide a current in a direction substantially perpendicular to a surface of the magnetoresistive film.

19 Claims, 4 Drawing Sheets

MAGNETORESISTIVE ELEMENT, MAGNETORESISTIVE HEAD AND MAGNETIC REPRODUCING APPARATUS

CROSS-REFERENCE TO RELATED APPLICATIONS

This application is based upon and claims the benefit of priority from the prior Japanese Patent Application No. 2002-378648, filed Dec. 26, 2002, the entire contents of which are incorporated herein by reference.

BACKGROUND OF THE INVENTION

1. Field of the Invention

The present invention relates to a magnetoresistive element using a magnetoresistive film in which a sense current is flowed in a direction substantially perpendicular to the film surface, a magnetoresistive head using the particular magnetoresistive element, and a magnetic reproducing apparatus having the magnetoresistive head installed therein.

2. Description of the Related Art

In a certain type of a ferromagnetic material, it is known that the electrical resistance is changed in accordance with the intensity of an external magnetic field. This particular phenomenon is called the magnetoresistive effect and can be used for detecting an external magnetic field. A field-sensing element utilizing the magnetoresistive effect is called a magnetoresistive element, hereinafter referred to as an "MR element" in some cases.

The MR element is utilized in a magnetic head for reading information stored on a magnetic recording medium in a magnetic reproducing apparatus utilizing a magnetic recording medium such as a hard disk or a magnetic tape, and the particular magnetic head is called an MR head.

In recent years, magnetic recording density is being made higher in the magnetic recording-reproducing apparatus utilizing the MR head, particularly, in a hard disk apparatus, with the result that the size of one bit is being made smaller and the leakage magnetic flux from the bit, i.e., the signal magnetic field, is being made lower. Such being the situation, an MR element of high sensitivity and a high signal-to-noise ratio, which is capable of providing a high magnetoresistive ratio even under a lower magnetic field, is required for reading information written on a magnetic recording medium with a high density.

Under the circumstances, a giant magnetoresistive element (GMR element), i.e., a so-called "spin-valve film", that permits to provide a high MR ratio is generally used nowadays as the MR element included in the hard disk MR head.

The spin-valve film has a stacked structure comprising a ferromagnetic layer F, a non-magnetic layer S, a ferromagnetic layer P, and an antiferromagnetic layer, which are stacked in the order mentioned. The ferromagnetic layer P and the ferromagnetic layer F are in a magnetically non-coupled state with the nonmagnetic layer S interposed therebetween. The magnetization of the ferromagnetic layer P is pinned by the exchange bias with the antiferromagnetic material, and the magnetization of the ferromagnetic layer F can be easily rotated by, for example, an external magnetic field (e.g., an signal magnetic field). It is possible to obtain a high magnetoresistive effect by allowing the magnetization of the ferromagnetic layer F alone to be rotated by the external magnetic field so as to change the relative angle made between the magnetization directions of the two ferromagnetic layers.

The ferromagnetic layer F may be referred to as a free layer, a field-sensing layer or a magnetization free layer. The ferromagnetic layer P may be referred to as a pinned layer or a magnetization pinned layer. The nonmagnetic layer S may be referred to as a spacer layer, an interface regulating intermediate layer or an intermediate layer.

In the GMR head widely used nowadays, employed in general is a system in which a sense current is flowed in a direction parallel to the film surface to measure the resistance in the direction parallel to the film surface. This system is generally called a current-in-plane (CIP) system. In the case of the CIP system, it is possible to obtain an MR ratio of about 10 to 20%. However, it is expected that an even higher MR ratio be required in order to achieve reproduction at a high recording density exceeding 200 Gbit/inch$^2$. On the other hand, it is difficult to obtain an MR ratio exceeding 20% when it comes to the CIP spin-valve film available nowadays. As a result, the situation as to how much the MR ratio can be increased is a serious problem that must be solved for further improving the recording density.

Under the circumstances, a current-perpendicular-to-plane (CPP) GMR film, which is generally said to exhibit an MR ratio higher than that of the CIP-GMR film, is attracting attention. In the CPP system, a sense current is flowed in a direction perpendicular to the film surface. However, in the CPP-GMR film, the resistance of the portion corresponding to the thickness of the GMR film is to be measured and, thus, the unit-area resistance is made very low. As a result, the output as the resistance of the element is very low so as to give rise to a problem that it is impossible to obtain a high signal-to-noise ratio.

In order to overcome the aforementioned problems of the low resistance and the low MR ratio, a CPP-GMR element provided with a resistance adjustment layer having a current confining effect is proposed in, for example, U.S. Pat. No. 6,348,274. In this prior art, however, the interlayer coupling ($H_{in}$) between the free layer and the pinned layer is made prominent so as to give rise to a problem that the breakdown voltage is lowered.

BRIEF SUMMARY OF THE INVENTION

An object of the present invention is to provide a magnetoresistive element of a high sensitivity adaptable to the high magnetic recording density required in the future, which has a low interlayer coupling field and a high breakdown voltage while maintaining appropriate resistance and a high MR ratio, a magnetic head using the particular magnetoresistive element and a magnetic reproducing apparatus using the particular magnetic head.

A magnetoresistive element according to an aspect of the present invention of the present invention comprises: a magnetoresistive film comprising a magnetization pinned layer, a magnetization free layer, and a nonmagnetic intermediate layer, a magnetization direction of the magnetization pinned layer substantially fixed in an external magnetic field, a magnetization direction of the magnetization free layer configured to change in the external magnetic field, the nonmagnetic intermediate layer formed between the magnetization pinned layer and the magnetization free layer and having a stacked structure of a first non-metallic intermediate layer/a metal intermediate layer/a second non-metallic intermediate layer; and a pair of electrodes coupled to the magnetoresistive film and configured to provide a current in a direction substantially perpendicular to a surface of the magnetoresistive film.

A magnetic head according to another aspect of the present invention of the present invention comprises the above magnetoresistive element.

A magnetic reproducing apparatus according to still another aspect of the present invention of the present invention comprises the above magnetic head, and a magnetic recording medium.

BRIEF DESCRIPTION OF THE SEVERAL VIEWS OF THE DRAWING

FIG. 6 shows an R-H curve for Comparative Example 1a;

FIG. 8 shows the I-V characteristics for Example 1 of the present invention and Comparative Example 1a;

DETAILED DESCRIPTION OF THE INVENTION

Embodiments of the present invention will now be described with reference to the accompanying drawings.

Figure 1:
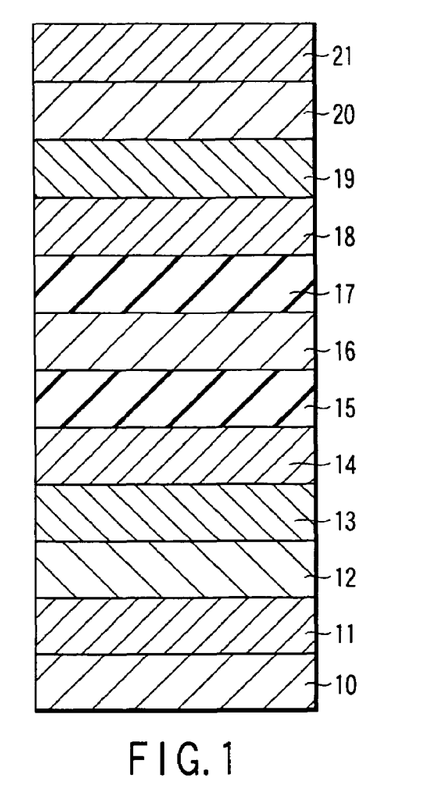
FIG. 1 is a cross-sectional view of a magnetoresistive element according to one embodiment of the present invention.

FIG. 1 is a cross-sectional view of a magnetoresistive element (CPP-SV film) according to one embodiment of the present invention. As shown in the drawing, the CPP-SV film comprises a lower electrode 10, an underlayer 11, an antiferromagnetic layer 12, a magnetization pinned layer (pinned layer) 13, a second interface metal layer 14, a second non-metallic intermediate layer 15, a metal intermediate layer 16, a first non-metallic intermediate layer 17, a first interface metal layer 18, a magnetization free layer (free layer) 19, a protective layer 20, and an upper electrode 21, which are stacked on a substrate (not shown) in the order mentioned. The pinned layer 13 is formed in contact with the antiferromagnetic layer 12. The magnetization of the pinned layer 13 is pinned by the exchange coupling between the pinned layer 13 and the antiferromagnetic layer 12. The magnetizing direction of the free layer 19 is changed freely by an external magnetic field generated from the magnetic recording medium facing to the air-bearing surface thereof. The pair of electrodes may be detached from top surface of the uppermost layer, for example, the protective layer 20, and bottom surface of the lowermost layer, for example, the underlayer 11, while other conductive layers are formed therebetween.

Figure 2:
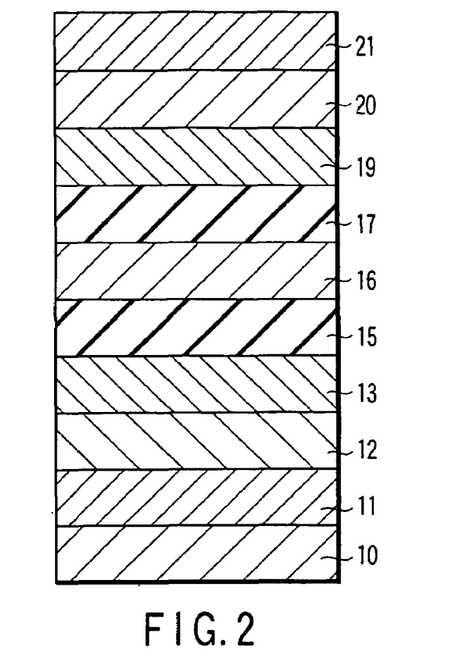
FIG. 2 is a cross-sectional view of a magnetoresistive element according to another embodiment of the present invention.

FIG. 2 is a cross-sectional view of a CPP-SV film according to another embodiment of the present invention. As shown in the drawing, the CPP-SV film comprises a lower electrode 10, an underlayer 11, an antiferromagnetic layer 12, a magnetization pinned layer (pinned layer) 13, a second non-metallic intermediate layer 15, a metal intermediate layer 16, a first non-metallic intermediate layer 17, a magnetization free layer (free layer) 19, a protective layer 20, and an upper electrode 21, which are stacked on a substrate (not shown) in the order mentioned. In other words, the CPP-SV film shown in FIG. 2 has a structure that the second and first interface metal layers 14 and 18 are omitted from the CPP-SV film shown in FIG. 1.

Incidentally, it is possible to increase the number of non-metallic intermediate layers so as to form such a structure as non-metallic intermediate layer/metal intermediate layer/non-metallic intermediate layer/metal intermediate layer/non-metallic intermediate layer.

In the magnetoresistive element according to the embodiments of the present invention, a stack of a non-metallic intermediate layer, a metal intermediate layer and a non-metallic intermediate layer is formed as the intermediate layer positioned between the free layer and the pinned layer, as shown in FIGS. 1 and 2. Since the two non-metallic intermediate layers are separated from each other by the metal intermediate layer, it is possible to lower interlayer magnetic coupling acting between the free layer and the pinned layer due to the increase in the thickness of the intermediate layer between the free layer and the pinned layer. In addition, the voltage applied to each non-metallic intermediate layer is lowered so as to improve the breakdown voltage. These effects will now be described.

In general, a shift $H_{sh}$ for a bias point is generated relative to the central axis of a R-H curve of a CPP-SV film obtained by hysteresis measurement. Here, it is desirable to adjust the film so as to achieve $H_{sh}=0$. The shift $H_{sh}$ is represented by:

$$H_{sh}=H_{in}+H_{or}-H_d,$$

where $H_{in}$ is RKKY-like interface coupling, $H_{or}$ is interface coupling attributed to interface roughness, and $H_d$ is a biasing effect produced by a leakage magnetic field from the pinned layer. Incidentally, it is possible to make $H_d$ close to 0, i.e., Hd≈0, by modifying the structure of the pinned layer.

Where the stack of non-metallic intermediate layer/metal intermediate layer/non-metallic intermediate layer is inserted between the free layer and the pinned layer as in the magnetoresistive element according to the embodiments of the present invention, it is possible to increase substantially the distance between the free layer and the pinned layer, compared with the magnetoresistive element in which a single non-metallic intermediate layer is inserted between the free layer and the pinned layer. As a result, in the embodiments of the present invention, it is possible to make very small the RKKY-like interface coupling ($H_{in}$) and the interface coupling ($H_{or}$) due to the interface roughness so as to reduce the shift $H_{sh}$.

The breakdown voltage in the magnetoresistive element according to the embodiments of the present invention will now be described. Since the magnetoresistive element of the present invention includes a stack of non-metallic intermediate layer/metal intermediate layer/non-metallic intermediate layer, the voltage applied to a single non-metallic intermediate layer is lowered. Suppose an operating voltage $V_t$ is applied to a magnetoresistive element. In this case, the voltage applied to a single non-metallic intermediate layer is about $V_t/n$ in the case where n numbers of non-metallic intermediate layers (n>1) are arranged in a magnetoresistive element, and is about $V_B/2$ in the case where two non-metallic intermediate layers are arranged in a magnetoresistive element. It follows that, where the breakdown voltage is $V_B$ in the case where a single non-metallic intermediate layer is arranged in a magnetoresistive element, the breakdown voltage is about $nV_B$ in the case where n numbers of non-metallic intermediate layers are arranged in a magnetoresistive element, and the breakdown voltage is about $2V_B$ in the case where two non-metallic intermediate layers are arranged in a magnetoresistive element. Incidentally, in order to improve a breakdown voltage in a magnetoresistive element having a single non-metallic intermediate layer, it is necessary to increase the thickness of the non-metallic intermediate layer. In this case, however, unit-area resistance (RA) is also increased, with the result that the magnetoresistive element cannot be used in a magnetic head.

Each layer included in the magnetoresistive element according to the embodiments of the present invention will now be described in detail.

<Morphology of Non-metallic Intermediate Layer>

Figure 3:
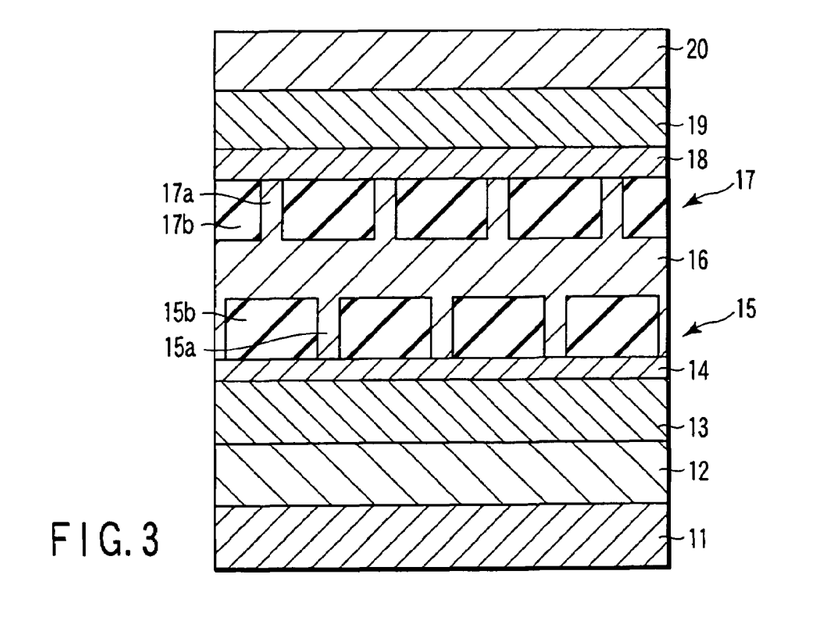
FIG. 3 is a cross-sectional view of a magnetoresistive element according to another embodiment of the present invention.
Figure 4:
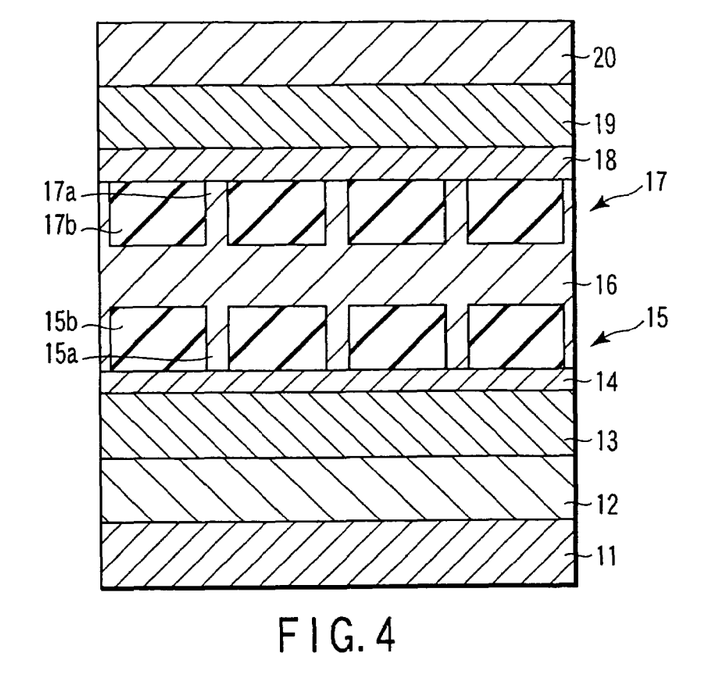
FIG. 4 is a cross-sectional view of a magnetoresistive element according to another embodiment of the present invention.

Morphology of the non-metallic intermediate layer will now be described with reference to FIGS. 3 and 4. As shown in FIGS. 3 and 4, the non-metallic intermediate layer 15 (17) is formed of two or more phases including a conductive phase 15a (17a) and an insulating phase 15b (17b). The conductive phase is present in a columnar configuration and functions as a current path. The insulating phase is formed of an oxide, an oxynitride or a nitride. The non-metallic intermediate layer 15 (17) serves to reduce the cross section of a current path, sectioned with a plane parallel to the surface of the non-metallic intermediate layer, so as to confine the current. The conductive phase denotes a portion that shows ohmic conduction characteristics. Therefore, the conductive phase may include a small amount of oxygen. Whether or not the non-metallic intermediate layer 15 (17) shows the ohmic conduction can be judged by measuring the temperature characteristics of resistance within a temperature range of between 4.2K and about 300K, or within at least a temperature range of between 77K and room temperature. In the case of the ohmic conduction, the resistance falls with decrease of the temperature. On the other hand, in the case of, for example, the tunnel conduction, it is observed that the resistance tends to increase with decrease of the temperature. Also, in the case of the ohmic conduction, there is observed in I-V (sense current-to-output voltage) characteristics that the voltage V is not completely proportional to the current I but tends to be slightly shifted toward the high voltage side.

It is desirable that a size of the conductive phase be 10 nm or less. If the size of the conductive phase exceeds 10 nm, the current confining effect is made very low so as to make it impossible to adjust the unit-area resistance RA. Also, taking the effect of improvement in MR ratio and distribution of the conductive phase described below into consideration, it is more desirable that the size of the conductive phase be 5 nm or less.

It is desirable that an area ratio of the conductive phase in the film surface of the non-metallic intermediate layer falls in a range of 1% to 20%. If the area ratio is lower than 1%, the resistance of the element is made excessively high. If the area ratio exceeds 20%, the current confining effect is decreased so as to lower the MR ratio.

It is desirable that the number density of the conductive phases in the film surface of the non-metallic intermediate layer is at least 20 per 0.1 $\mu m^2$. If the number of conductive phases per 0.1 $\mu m^2$ is smaller than 20, reduction in output of the CPP-GMR head caused by lowered sensitivity in the vicinity of the surface of the head floated on a disc and dual-peak in a track profile are observed.

On the other hand, according to observation of a planar transmission electron microscopy (TEM) image and nano-scale energy dispersive X-ray (nano-EDX) analysis, which provides a direct method for determining local composition, the element for the current path such as Cu, Ag, Au, Ru, Ir, Pt and Os is detected in the conductive phase in a larger amount than the element forming oxide (or oxynitride) constituting the matrix phase. In other words, two-dimensional fluctuation in composition is observed in the film surface. Also, where the local current characteristics are measured by, for example, conductance atomic force microscopy (AFM) or tunneling AFM (TUNA), two-dimensional resistance distribution or two-dimensional current distribution is observed within the film surface, which makes it possible to discriminate the conductive phase and the insulating phase. In the case of the conductance AFM measurement, the portion having high conductance (or low resistance) corresponds to the conductive phase. In the case of the TUNA measurement, which is carried out under a constant voltage, the portion where high current is observed corresponds to the conductive phase.

FIGS. 3 and 4 show two types of structures of the non-metallic intermediate layers. FIG. 3 covers the case where conductive phases of the non-metallic intermediate layers 15, 17 are arranged off registration along the direction perpendicular to the film surface. FIG. 4 covers the case where the conductive phases of the non-metallic intermediate layers 15, 17 are arranged in registration along the direction perpendicular to the film surface. Each of these structures produces the effect of increasing the resistance of the element to fall within an optimum range.

<Materials for Non-metallic Intermediate Layer>

The non-metallic intermediate layer is constituted by a conductive phase and an insulating phase. The conductive phase of the non-metallic intermediate layer contains at least one element selected from the group consisting of Cu, Au, Ag, Pt, Pd, Ir and Os. The portion in which the conductive element is contained in a large amount forms the conductive phase performing the ohmic conduction. In this case, it is desirable that the amount of conductive element be at least 1 atomic % and smaller than 50 atomic % based on the entire non-metallic intermediate layer. Under the particular condition, it is possible to form the two-dimensional distribution of the conductive characteristics described above.

The insulating phase of the non-metallic intermediate layer is formed of an oxide, an oxynitride or a nitride of at least one element selected from the group consisting of boron (B), silicon (Si), germanium (Ge), tantalum (Ta), tungsten (W), niobium (Nb), aluminum (Al), molybdenum (Mo), phosphorus (P), vanadium (V), arsenic (As), antimony (Sb), zirconium (Zr), titanium (Ti), zinc (Zn), lead (Pb), thorium (Th), beryllium (Be), cadmium (Cd), scandium (Sc), lanthanum (La), yttrium (Y), praceodymium (Pr), chromium (Cr), tin (Sn), gallium (Ga), indium (In), rhodium (Rh), palladium (Pd), magnesium (Mg), lithium (Li), barium (Ba), calcium (Ca), strontium (Sr), manganese (Mn), iron (Fe), cobalt (Co), nickel (Ni), rubidium (Rb), and a rare earth metal.

In particular, B, Si, Ge, W, Nb, Mo, P, V, Sb, Zr, Ti, Zn, Pb, Cr, Sn, Ga, Fe, Co and a rare earth metal of the above elements tend to form a crystalline oxide. On the other hand, Al and Ta tend to form an amorphous oxide. Deficiency or surplus of oxygen atoms in the crystalline oxide tends to affect the conductive characteristics compared with the case of the amorphous oxide. Therefore, the crystalline oxide is advantageous in that a two-dimensional modulation of the conductive characteristics may be formed easily in the film surface of the non-metallic intermediate layer, and in that the composition modulation may be formed easily in generation of an alloy phase with Cu, Ag, Au, Ru, Ir, Pt and Os described above as the element for the conductive phase.

In forming the non-metallic intermediate layer, oxidation, oxynitriding or nitriding is carried out in many cases by using alloys of the elements noted above. The method for performing the oxidation, oxynitriding or nitriding includes, for example, natural oxidation in which oxygen gas is simply introduced into a deposition chamber, ion-assisted oxidation (or oxynitriding) in which oxygen gas is introduced into a deposition chamber and a deposited film is irradiated with ions of Ar of $N_2$, and ion beam oxidation (or nitriding) in which a deposited film is irradiated with oxygen (or nitrogen) ions.

Incidentally, the two non-metallic intermediate layers may be different from each other in the thickness and the composition.

<Metal Intermediate Layer>

Figure 5:
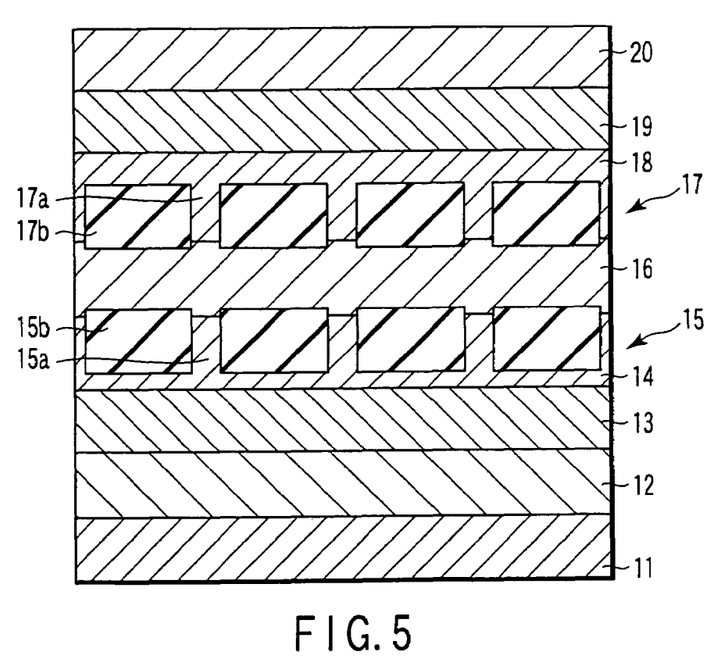
FIG. 5 is a cross-sectional view of a magnetoresistive element according to another embodiment of the present invention.

The metal intermediate layer is formed of a thin film of a metal such as Al, Cu, Ag, Au, Ru, Ir, Pt or Os. From the point of view of the improvement in MR ratio, it is most desirable to use a Cu thin film. From the point of view of oxidation resistance, it is also desirable to use a thin film of Au, Pt or Ru. It is desirable that the element used for forming the metal intermediate layer is equal to that contained in the non-metallic intermediate layer. FIGS. 3 and 4 cover the case where the metal intermediate layer 16 and the conductive phases 15a, 17a of the non-metallic intermediate layers 15, 17 are formed of the same material. Also, the metal intermediate layer 16 and the conductive phases 15a, 17a of the non-metallic intermediate layers 15, 17 may be formed of different materials as shown in FIG. 5. In this case, it is possible for a part of the metal intermediate layer to intrude into the conductive phases 15a, 17a of the non-metallic intermediate layers 15, 17, as shown in FIG. 5.

The metal intermediate layer may be formed of a single layer or a plurality of layers. For example, it is conceivable to employ a stacked structure of Cu/Al/Cu or Au/Al/Au, where Al has a low electron scattering property of and brings about a large spin diffusion length. In this case, it is desirable to use a metal that is unlikely to be oxidized such as Au, Ru or Pt for forming the portion of the metal intermediate layer contacting with the non-metallic intermediate layer.

It is desirable for the metal intermediate layer to have a thickness of 0.5 nm or more. If the thickness of the metal intermediate layer is smaller than 0.5 nm, the mixing with the lower or upper non-metallic intermediate layer is caused by the energy of the incoming particles in the deposition process. As a result, the metal intermediate layer is put in a state of being taken in the non-metallic intermediate layer. It follows that the metal intermediate layer fails to separate the two non-metallic intermediate layers, resulting in failure to produce the effects in terms of reduction of $H_{in}$ and improvement of the breakdown voltage. It is desirable for the metal intermediate layer to have a thickness of 20 nm or less. If the thickness of the metal intermediate layer exceeds 20 nm, the number of electrons performing ballistic conduction between the two non-metallic intermediate layers tends to be decreased. In other words, the retention of spin information is lowered by spin diffusion so as to significantly decrease the MR ratio. Where the thickness of the metal intermediate layer is not larger than 20 nm, the reduction of the MR ratio is moderate.

Incidentally, where composition analysis is performed by EDX with cross-sectional TEM observation in a nano-scale region of the stack of non-metallic intermediate layer/metal intermediate layer, gradation is observed in the oxygen distribution. In other words, it is not strictly necessary that the non-metallic intermediate layer be clearly discriminated from the metal intermediate layer. Likewise, gradation (composition modulation) in the distribution of an element other than oxygen may be observed between the metal intermediate layer and the non-metallic intermediate layer.

<Effect of First Interface Metal Layer>

In the magnetoresistive film shown in FIG. 1, the first interface metal layer 18 is formed between the free layer 19 and the first non-metallic intermediate layer 17. The first interface metal layer 18 contributes to make magnetic properties of the free layer 19 softer. To be more specific, since (111) orientation and crystalline properties of the free layer 19 are improved because of the first interface metal layer 18 so as to relax film stress caused by lattice mismatch, coercivity Hc of the free layer 19 is lowered. On the other hand, if the free layer 19 is in direct contact with the non-metallic intermediate layer 17 formed of an oxide, an oxynitride or a nitride, the free layer 19 tends to be affected by oxygen or nitrogen so that coercivity thereof is increased. Such being the situation, it is desirable to form the first interface metal layer 18 between the free layer 19 and the first non-metallic intermediate layer 17.

<Effect of Second Interface Metal Layer>

In the magnetoresistive film shown in FIG. 1, the second interface metal layer 14 is formed between the pinned layer 13 and the second non-metallic intermediate layer 15. The second interface metal layer 14 produces an effect of preventing oxidation of the pinned layer 13 during the oxidizing process for forming the second non-metallic intermediate layer 15. Also, where the second interface metal layer 14 is formed, it is possible to prevent the pinned layer 13 from being oxidized by oxygen diffused from the second non-metallic intermediate layer 15 in an annealing process. Therefore, it is possible to suppress degradation in exchange coupling field by the pinned layer 13.

Also, gradation of composition (composition modulation) may be observed in a direction perpendicular to the film surface in a cross section of a stack of interface metal layer/non-metallic intermediate layer/metal intermediate layer/non-metallic intermediate layer/interface metal layer. To be more specific, it is not always necessary that clear separation of the composition be observed in nano-scale composition analysis with cross-sectional TEM observation. Particularly, in the case of using the same material for forming the interface metal layer, the conductive phase of the non-metallic intermediate layer and the metal intermediate layer, the interfaces between the adjacent layers observed by cross-sectional TEM may possibly be made unclear.

<Explanation of Free Layer>

It is possible to use Co, Fe, Ni or an alloy containing these elements as a ferromagnetic material constituting the free layer. Typically, a $Co_{90}Fe_{10}$ alloy, a CoFeNi alloy, or a $Ni_{80}Fe_{20}$ alloy (permalloy) is used for the free layer.

The free layer preferably has a face-centered cubic (fcc) structure and is oriented such that the (111) plane is made parallel to the film surface in order to exhibit satisfactory soft magnetic properties. Incidentally, the orientation of the free layer may partly include hcp (0001) orientation or bcc (110) orientation.

It is desirable to control the free layer in the anisotropic property and the domain configuration by applying a magnetic bias (biasing control) to the free layer by means of a hard magnetic film (hard biasing film) or an antiferromagnetic film (patterned biasing film).

<Explanation of Pinned Layer>

It is possible to use, for example, a $Co_{90}Fe_{10}$ film, a $Fe_{50}Co_{50}/Cu$ stacked film or a $Ni_{80}Fe_{20}$ film as the ferromagnetic material constituting the pinned layer, like the material constituting the free layer.

It is possible for the pinned layer to have a so-called "synthetic structure". The basic structure of the synthetic pinned layer is a stacked structure of ferromagnetic layer/nonmagnetic layer/ferromagnetic layer. In this structure, the two ferromagnetic layers are antiferromagnetically coupled with each other through the nonmagnetic layer interposed therebetween. Ruthenium (Ru) is used typically as a material of the nonmagnetic layer.

The magnetization of the pinned layer is pinned in one direction by exchange coupling with the antiferromagnetic layer as described above. The material of the antiferromagnetic layer includes a Mn-based alloy containing Pt, Ir, Rh, Ru or Pd. The typical antiferromagnetic materials include a PtMn alloy, a PtPdMn alloy and an IrMn alloy.

EXAMPLES

Examples of the present invention will now be described.

Example 1

A lower electrode film 10 was formed in a thickness of about 100 nm on a Si (100) substrate, followed by patterning the lower electrode film 10 by photolithography and dry etching. Then, a CPP-SV film of the structure shown in FIG. 1, which included the layers 11 to 20 given below, was deposited on the lower electrode 10 (Example 1). Each layer was deposited with a DC magnetron sputtering apparatus.

Underlayer 11: Ta/Ru;
Antiferromagnetic layer 12: PtMn;
Pinned layer 13: CoFe/Ru/CoFe;
Second interface metal layer 14: Cu;
Second non-metallic intermediate layer 15: an oxidized product of AlCu (thickness: 0.7 nm);
Metal intermediate layer 16: Cu (2 nm);
First non-metallic intermediate layer 17: an oxidized product of AlCu (thickness: 0.7 nm);
First interface metal layer 18: Cu;
Free layer 19: CoFe;
Protective layer 20: Cu/Ta.

It should be noted that, in Example 1, the intermediate layer between the pinned layer and the free layer is made of a stack of the second interface metal layer (Cu), the second non-metallic intermediate layer (oxidized AlCu), the metal intermediate layer (Cu), the first non-metallic intermediate layer (oxidized AlCu) and the first interface metal layer (Cu).

For comparison, CPP-SV films similar to that for Example 1, except that the intermediate layer between the pinned layer and the free layer was made of a stack of the second interface metal layer (Cu), non-metallic intermediate layer (oxidized AlCu layer) and first interface metal layer (Cu) are formed as Comparative Example 1a and Comparative Example 1b. Incidentally, the non-metallic intermediate layer for the Comparative Example 1a was prepared by oxidizing an AlCu film having a thickness of 0.7 nm and the non-metallic intermediate layer for the Comparative Example 1b was prepared by oxidizing an AlCu film having a thickness of 1.0 nm.

The oxidation for forming the non-metallic intermediate layer was carried out by ion-assisted oxidation (IAO) in which oxygen gas is introduced into a chamber and a deposited film is irradiated with Ar ions. The amount of oxygen introduced into the chamber was controlled to fall in a range of 1 kL to 20 kL. The CPP-SV film thus formed was patterned using photolithography and ion milling. The size of the CPP-SV film fell in a range of 0.2 μm to 5.0 μm, and the CPP-SV film was patterned is a square. Then, an upper electrode 21 was formed.

The magnetic characteristics, the MR ratio and the I-V characteristics of the CPP-SV film were measured for each of Example 1, Comparative Example 1a and Comparative Example 1b. The MR ratio was obtained from the dR-R plot. To be more specific, when R was plotted on the X-axis and dR was plotted on the Y-axis, the MR ratio was defined as inclination of a dR-R straight line multiplied by 100. The unit-area resistance RA was calculated from R-1/A plot (where A denotes the element area). In this case, when 1/A was plotted on the X-axis and R was plotted on the Y-axis, the unit-area resistance RA was defined as inclination of a R-1/A straight line.

The MR ratio was found to be 2.7% for Example 1 and 2.5% for Comparative Example 1a. Thus, Example 1 and Comparative Example 1a were found to be substantially equal to each other in the MR ratio.

The unit-area resistance RA was found to be 350 $m\Omega\mu m^2$ for Example 1 and 300 $m\Omega\mu m^2$ for Comparative Example 1a. It has been found that, in Example 1, increase in the unit-area resistance RA can be suppressed up to some extent so as to fall in a range (i.e., 500 $m\Omega\mu m^2$ or less) where the magnetoresistive element can be used for the magnetic head under ultra-high recording density of 100 Gbpsi or more.

Figure 6:
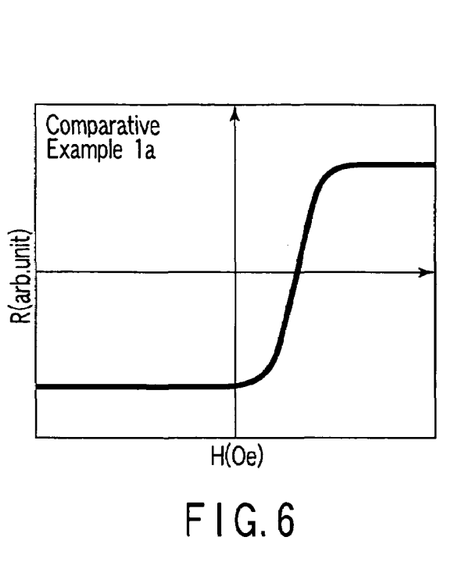
Figure 7:
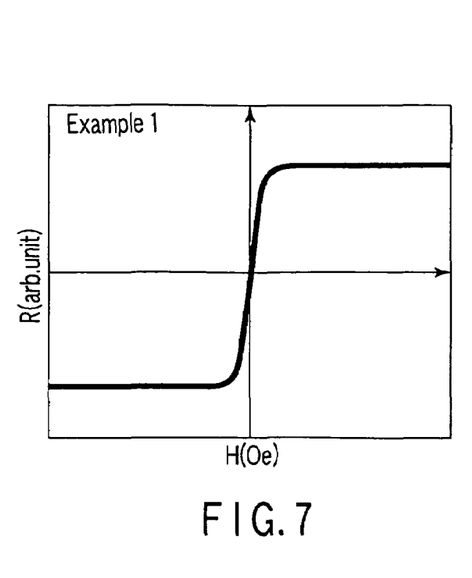
FIG. 7 shows an R-H curve for Example 1 of the present invention.

FIG. 6 shows the R-H curve for Comparative Example 1a, and FIG. 7 shows the R-H curve for Example 1. As apparent from these drawings, the shift $H_{sh}$ for Comparative Example 1a was about 30 Oe. On the other hand, the shift $H_{sh}$ for Example 1 was lowered to about 5 Oe, supporting that the magnetoresistive element of the present invention exhibits highly excellent characteristics. Example 1 was found to exhibit a substantially just bias point.

Figure 8:
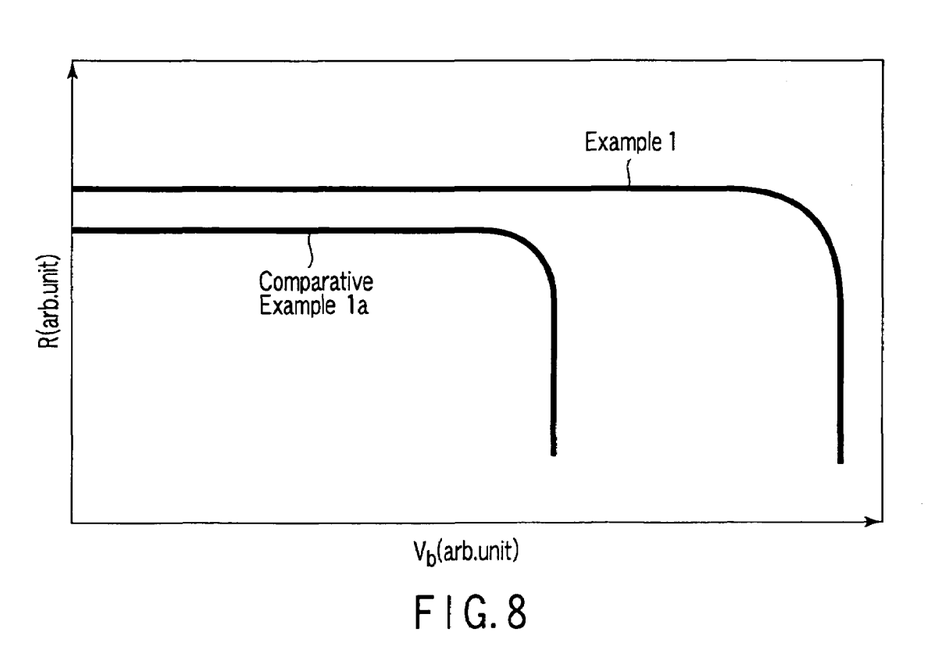

FIG. 8 shows the I-V characteristics for Comparative Example 1a and Example 1. In Comparative Example 1a, the breakdown voltage $V_B$ was found to be about 350 mV. On the other hand, the breakdown voltage VB for Example 1 was improved to about 750 mV.

In Comparative Example 1b, the unit-area resistance RA was high, i.e., about 2.0 $\Omega cm^2$. In addition, the MR ratio was lowered to 1.5%. Also, in Comparative Example 1b, the breakdown voltage $V_B$ was 400 mV and, thus, an appreciable improvement was not observed.

Examples 2 to 4 and Comparative Examples 2 to 4

Experiments were conducted by forming CPP-SV films of the structure similar to that for Example 1 or Comparative Example 1a using a material other than the oxide of the AlCu alloy for forming the non-metallic intermediate layer.

To be more specific, in Examples 2 to 4, the intermediate layer between the pinned layer and the free layer was made of a stack of the second interface metal layer, the second non-metallic intermediate layer, the metal intermediate layer, the first non-metallic intermediate layer and the first interface metal layer (referred to as a dual-layer as to the non-metallic intermediate layers).

On the other hand, in the Comparative Examples 2 to 4, the intermediate layer between the pinned layer and the free layer was of a stack of the second interface metal layer, the non-metallic intermediate layer and the first interface metal layer (referred to as a single-layer as to the non-metallic intermediate layer).

The material of the non-metallic intermediate layer was as follows:

Example 2, Comparative Example 2: an oxidized product of $Cr_{90}Cu_{10}$ (thickness: 0.65 nm);

Example 3, Comparative Example 3: an oxidized product of $(Cr_{0.9}Cu_{0.1})_{97}B_3$ (thickness: 0.9 nm);

Example 4, Comparative Example 4: an oxidized product of $(Cr_{0.9}Cu_{0.1})_{95}Hf_3B_2$ (thickness: 0.9 nm).

The materials of the other layers of the CPP-SV film were equal to those for Example 1.

Table 1 shows the unit-area resistance RA, the MR ratio, and the breakdown voltage ($V_B$) for each of the CPP-SV films. As shown in Table 1, each of Examples 2 to 4 can provide the breakdown voltage ($V_B$) 500 mV or more.

TABLE 1

| | Structure for non-metallic intermediate layer | Material of non-metallic intermediate layer | RA ($m\Omega\ \mu m^2$) | MR ratio (%) | $V_B$ (mV) |
|---|---|---|---|---|---|
| Comparative Example 2 | Single-layer | $Cr_{90}Cu_{10}$—O [0.65 nm] | 300 | 5.1 | 280 |
| Example 2 | Dual-layer | | 550 | 3.0 | 520 |
| Comparative Example 3 | Single-layer | $(Cr_{0.9}Cu_{0.1})_{97}B_3$—O [0.9 nm] | 250 | 4.9 | 320 |
| Example 3 | Dual-layer | | 490 | 2.8 | 630 |
| Comparative Example 4 | Single-layer | $(Cr_{0.9}Cu_{0.1})_{95}Hf_3B_2$—O [0.7 nm] | 320 | 5.5 | 300 |
| Example 4 | Dual-layer | | 600 | 3.3 | 590 |

The magnetic head having the magnetoresistive element according to the embodiment of the present invention and the magnetic recording-reproducing apparatus having the particular magnetic head installed therein will now be described. The magnetoresistive element according to the embodiment of the present invention can be installed in a magnetic recording-reproducing apparatus by incorporating the magnetoresistive element in, for example, a read-write integral type magnetic head assembly.

Figure 9:
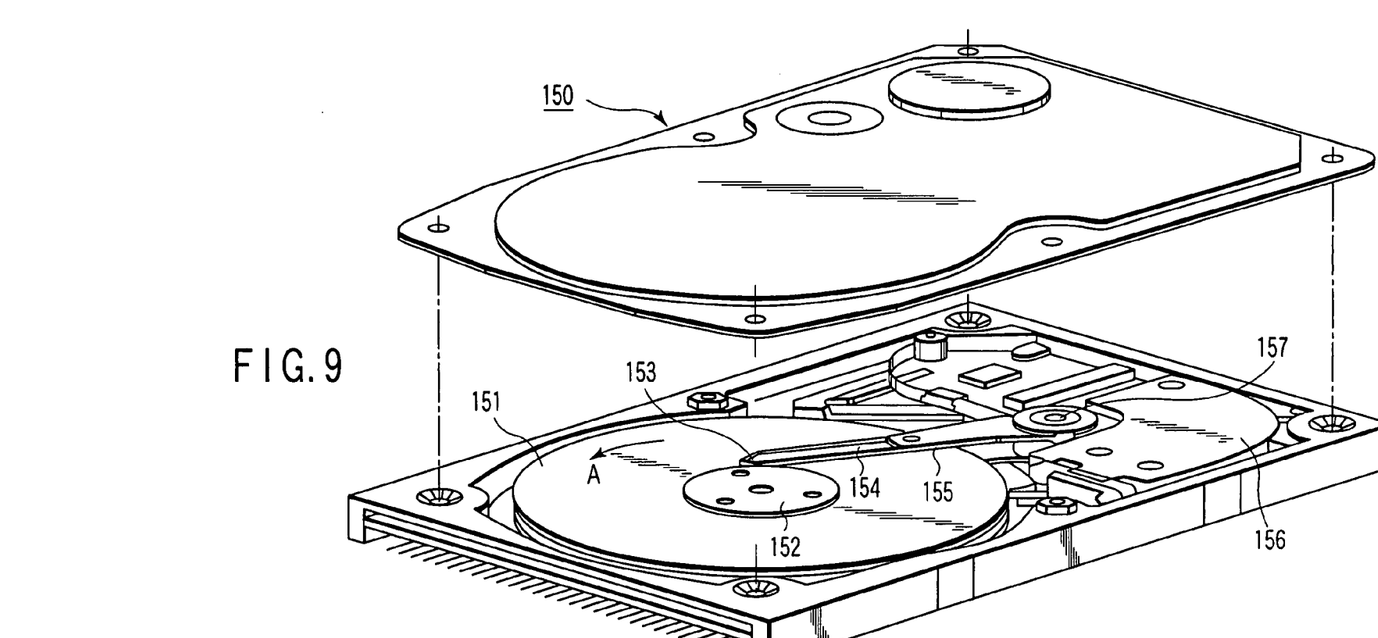
FIG. 9 is a perspective view showing a structure of a magnetic recording-reproducing apparatus according to one embodiment of the present invention.

FIG. 9 is a perspective view schematically showing the structure of a magnetic recording-reproducing apparatus 150. The magnetic recording-reproducing apparatus 150 is of a type using a rotary actuator. As shown in the drawing, a perpendicular magnetic recording disk 151 is mounted to a spindle 152 and is rotated in the direction denoted by an arrow A by a motor (not shown) in response to control signals supplied from a drive controller (not shown). The magnetic recording-reproducing apparatus 150 may be provided with a plurality of disks 151.

A head slider 153 for writing data in and for reading data from the disk 151 is mounted on the tip of a suspension 154. A magnetic head including the magnetoresistive element according to the embodiment of the present invention is formed on the tip portion of the head slider 153. When the disk 151 is rotated, the air-bearing surface (ABS) of the head slider 153 is held floating by a prescribed flying height from the surface of the disk 151. Incidentally, the magnetic recording-reproducing apparatus may be of a contact type that the head slider 153 is in contact with the disk 151.

The suspension 154 is connected to one end of an actuator arm 155 including a bobbin portion for holding a driving coil (not shown) on the other end. A voice coil motor 156, which is one of a linear motor, is arranged on the other end of the actuator arm 155. The voice coil motor 156 comprises a driving coil (not shown) wound onto the bobbin portion of the actuator arm 155 and a permanent magnet and a counter yoke arranged to face each other with the driving coil sandwiched therebetween where these members constitute a magnetic circuit. The actuator arm 155 is held by ball bearings (not shown) arranged at upper and lower portions of a pivot 157 and can be rotated by the voice coil motor 156.

Figure 10:
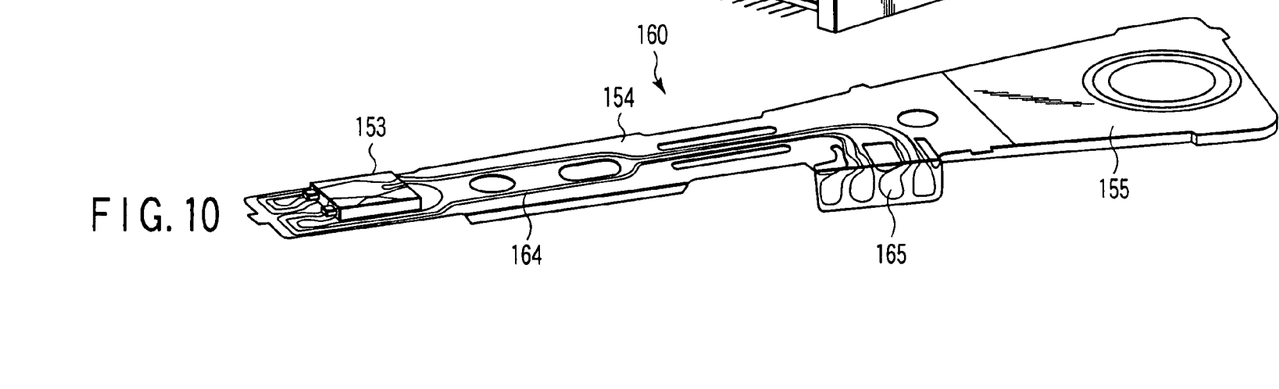
FIG. 10 is a perspective view showing a structure of a magnetic head assembly according to one embodiment of the present invention.

FIG. 10 is a perspective view showing the magnetic head assembly 160 in a magnified fashion, which is viewed from the disk side. To be more specific, the magnetic head assembly 160 comprises the actuator arm 155 including a bobbin portion for holding the driving coil, and the suspension 154 is connected to one end of the actuator arm 155. The head slider 153 having the magnetic head including the magnetoresistive element according to the embodiment of the present invention is mounted on the tip of the suspension 154. The suspension 154 includes lead wires 164 for writing and reading signals. The lead wires 164 are electrically connected to each of the electrodes of the magnetic head formed on the head slider 153. A reference numeral 165 shown in the drawing denotes electrode pads of the magnetic head assembly. According to the present invention, it is possible to read without fail the data recorded in the magnetic recording disk 151 even at a recording density markedly higher than that in the prior art by using the magnetic head including the magnetoresistive element described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element, comprising:
    a magnetoresistive film comprising a magnetization pinned layer, a magnetization free layer, and a nonmagnetic intermediate layer, a magnetization direction of the magnetization pinned layer substantially fixed in an external magnetic field, a magnetization direction of the magnetization free layer configured to change in the external magnetic field, the nonmagnetic intermediate layer formed between the magnetization pinned layer and the magnetization free layer and having a stacked structure of a first non-metallic intermediate layer/a metal intermediate layer/a second non-metallic intermediate layer, which are stacked in a thickness direction; and a pair of electrodes coupled to the magnetoresistive film and configured to provide a current in a direction substantially perpendicular to a surface of the magnetoresistive film.

2. The magnetoresistive element according to claim 1, wherein the metal intermediate layer has a thickness in a range of 0.5 nm to 20 nm.

3. The magnetoresistive element according to claim 1, wherein the first non-metallic intermediate layer is formed adjacent to the magnetization free layer, and the magnetoresistive element further comprising a first interface metal layer formed between the magnetization free layer and the first non-metallic intermediate layer.

4. The magnetoresistive element according to claim 1, wherein the second non-metallic intermediate layer is formed adjacent to the magnetization pinned layer, and the magnetoresistive element further comprising a second interface metal layer formed between the magnetization pinned layer and the second non-metallic intermediate layer.

5. The magnetoresistive element according to claim 4, wherein the second interface metal layer contains at least one metal selected from the group consisting of Al, Cu, Au, Ag, Pt, Pd, Ir and Os.

6. The magnetoresistive element according to claim 1, wherein the metal intermediate layer contains at least one metal selected from the group consisting of Al, Cu, Au, Ag, Pt, Pd, Ir and Os.

7. The magnetoresistive element according to claim 1, wherein each of the first and second non-metallic intermediate layers has a structure in which a columnar conductive phase is formed in an insulating phase formed of an oxide, an oxynitride or a nitride.

8. The magnetoresistive element according to claim 7, wherein the insulating phase contains an oxide, an oxynitride or a nitride of at least one element selected from the group consisting of B, Si, Ge, Ta, W, Nb, Al, Mo, P, V, As, Sb, Zr, Ti, Zn, Pb, Th, Be, Cd, Sc, La, Y, Pr, Cr, Sn, Ga, In, Rh, Pd, Mg, Li, Ba, Ca, Sr, Mn, Fe, Co, Ni, Rb and a rare earth metal, and the conductive phase contains an element selected from the group consisting of Cu, Au, Ag, Pt, Pd, Ir and Os.

9. The magnetoresistive element according to claim 7, wherein the columnar conductive phase has a size of 10 nm or less.

10. The magnetoresistive element according to claim 7, wherein an area ratio of the conductive phase in each of the surfaces of the first and second non-metallic intermediate layers is in a range of 1% to 20%.

11. The magnetoresistive element according to claim 7, wherein the conductive phases in the first and second non-metallic intermediate layers and the metal intermediate layer are formed of the same material.

12. The magnetoresistive element according to claim 7, wherein the conductive phases in the first and second non-metallic intermediate layers and the metal intermediate layer are formed of different materials.

13. The magnetoresistive element according to claim 1, further comprising an antiferromagnetic layer formed in contact with the magnetization pinned layer.

14. The magnetic reproducing apparatus according to claim 1, wherein the second non-metallic intermediate layer is formed adjacent to the magnetization pinned layer, and the magnetoresistive element further comprising a second interface metal layer formed between the magnetization pinned layer and the second non-metallic intermediate layer.

15. A magnetic reproducing head, comprising:

a magnetoresistive film comprising a magnetization pinned layer, a magnetization free layer, and a nonmagnetic intermediate layer, a magnetization direction of the magnetization pinned layer substantially fixed in an external magnetic field, a magnetization direction of the magnetization free layer configured to change in the external magnetic field, the nonmagnetic intermediate layer formed between the magnetization pinned layer and the magnetization free layer and having a stacked structure of a first non-metallic intermediate layer/a metal intermediate layer/a second non-metallic intermediate layer, which are stacked in a thickness direction; and a pair of electrodes coupled to the magnetoresistive film and configured to provide a current in a direction substantially perpendicular to a surface of the magnetoresistive film.

16. The magnetic reproducing head according to claim 15, the magnetoresistive element further comprising a first interface metal layer formed between the magnetization free layer and the first non-metallic intermediate layer.

17. The magnetic reproducing head according to claim 15, the magnetoresistive element further comprising a second interface metal layer formed between the magnetization pinned layer and the second non-metallic intermediate layer.

18. A magnetic reproducing apparatus, comprising:

a magnetic reproducing head, the magnetic reproducing head comprising a magnetoresistive film comprising a magnetization pinned layer, a magnetization free layer, and a nonmagnetic intermediate layer, a magnetization direction of the magnetization pinned layer substantially fixed in an external magnetic field, a magnetization direction of the magnetization free layer configured to change in the external magnetic field, the nonmagnetic intermediate layer formed between the magnetization pinned layer and the magnetization free layer and having a stacked structure of a first non-metallic intermediate layer/a metal intermediate layer/a second non-metallic intermediate layer, which are stacked in a thickness direction; and a pair of electrodes coupled to the magnetoresistive film and configured to provide a current in a direction substantially perpendicular to a surface of the magnetoresistive film.

19. The magnetic reproducing apparatus according to claim 17, wherein the second non-metallic intermediate layer is formed adjacent to the magnetization free layer, and the magnetoresistive element further comprising a second interface metal layer formed between the magnetization free layer and the second non-metallic intermediate layer.

* * * * *